US012317575B2

(12) United States Patent
Wei et al.

(10) Patent No.: US 12,317,575 B2
(45) Date of Patent: May 27, 2025

(54) SUPER-SEMICONDUCTORS BASED ON NANOSTRUCTURED ARRAYS

(71) Applicant: UNIVERSITY OF DELAWARE, Newark, DE (US)

(72) Inventors: BingQing Wei, Newark, DE (US); Zhigang Li, Newark, DE (US)

(73) Assignee: University of Delaware, Newark, DE (US)

( * ) Notice: Subject to any disclaimer, the term of this patent is extended or adjusted under 35 U.S.C. 154(b) by 0 days.

(21) Appl. No.: 18/864,780

(22) PCT Filed: May 11, 2023

(86) PCT No.: PCT/US2023/021885
§ 371 (c)(1),
(2) Date: Nov. 11, 2024

(87) PCT Pub. No.: WO2024/151282
PCT Pub. Date: Jul. 18, 2024

(65) Prior Publication Data
US 2025/0113509 A1 Apr. 3, 2025

Related U.S. Application Data

(60) Provisional application No. 63/340,993, filed on May 12, 2022.

(51) Int. Cl.
*H10F 30/22* (2025.01)
*H10D 8/30* (2025.01)
(Continued)

(52) U.S. Cl.
CPC ............ *H10D 8/30* (2025.01); *H10D 64/205* (2025.01); *H10D 64/62* (2025.01)

(58) Field of Classification Search
CPC ........... B82Y 5/00; B82Y 10/00; B82Y 15/00; B82Y 20/00; B82Y 25/00; B82Y 30/00;
(Continued)

(56) References Cited

U.S. PATENT DOCUMENTS 7,892,924 B1 2/2011 Lee et al.
2007/0059527 A1 3/2007 Jun et al.
(Continued)

OTHER PUBLICATIONS

International Search Report (PCT/ISA/210) and Written Opinion (PCT/ISA/237) mailed on Jul. 25, 2024, by the U.S. Patent Office as the International Searching Authority for International Application No. PCT/US2023/021885. (10 pages).

(Continued)

*Primary Examiner* — Eric A. Ward
(74) *Attorney, Agent, or Firm* — Buchanan Ingersoll & Rooney PC

(57) ABSTRACT

A super-semiconductor (SSC), semiconductor devices including the SSC, and methods for making the SSC. The SSC includes a bimetallic nanostructured array having a substrate and a nanoshell array disposed on the substrate. The nanoshell array is defined by a plurality of non-close-packed, non-conductive, core bodies disposed on the substrate, a first metal layer disposed on the non-conductive core bodies and on the substrate in areas located between adjacent non-conductive core-bodies, and at least a second metal layer disposed on the first metal layer, wherein the second metal is different than the first metal. The bimetallic nanostructured array exhibits p-type or n-type metal conductivity above a transition temperature, and in embodiments, exhibits resistivity in a range of $10^{-8}$-$10^{-7}$ ohm*m at a temperature of 300K+/−40K.

20 Claims, 11 Drawing Sheets

(51) Int. Cl.
*H10D 64/20* (2025.01)
*H10D 64/62* (2025.01)

(58) Field of Classification Search
CPC ......... B82Y 35/00; B82Y 40/00; B82Y 99/00; H10F 30/221; H10F 30/2212; H10F 30/2215; H10F 30/2218; H10F 30/222; H10F 30/223; H10F 30/2235
See application file for complete search history.

(56) References Cited

U.S. PATENT DOCUMENTS

| | | |
|---|---|---|
| 2008/0199510 A1 | 8/2008 | Ruane et al. |
| 2010/0028680 A1* | 2/2010 | Halas ................ C23C 18/1635 428/407 |
| 2012/0212733 A1 | 8/2012 | Kodali et al. |
| 2014/0161976 A1* | 6/2014 | Oh ........................ C09D 11/52 427/217 |
| 2015/0108425 A1 | 4/2015 | Rosenman et al. |
| 2019/0128894 A1* | 5/2019 | Jain ...................... C23C 16/403 |
| 2019/0355862 A1* | 11/2019 | Okamoto ................ C25B 1/55 |

OTHER PUBLICATIONS

Li et al., "Plasmon-induced Super-semiconductor at Room Temperature in Nanostructured Bimetallic Arrays", Applied Physics Reviews, May 17, 2022. (25 pages).

* cited by examiner

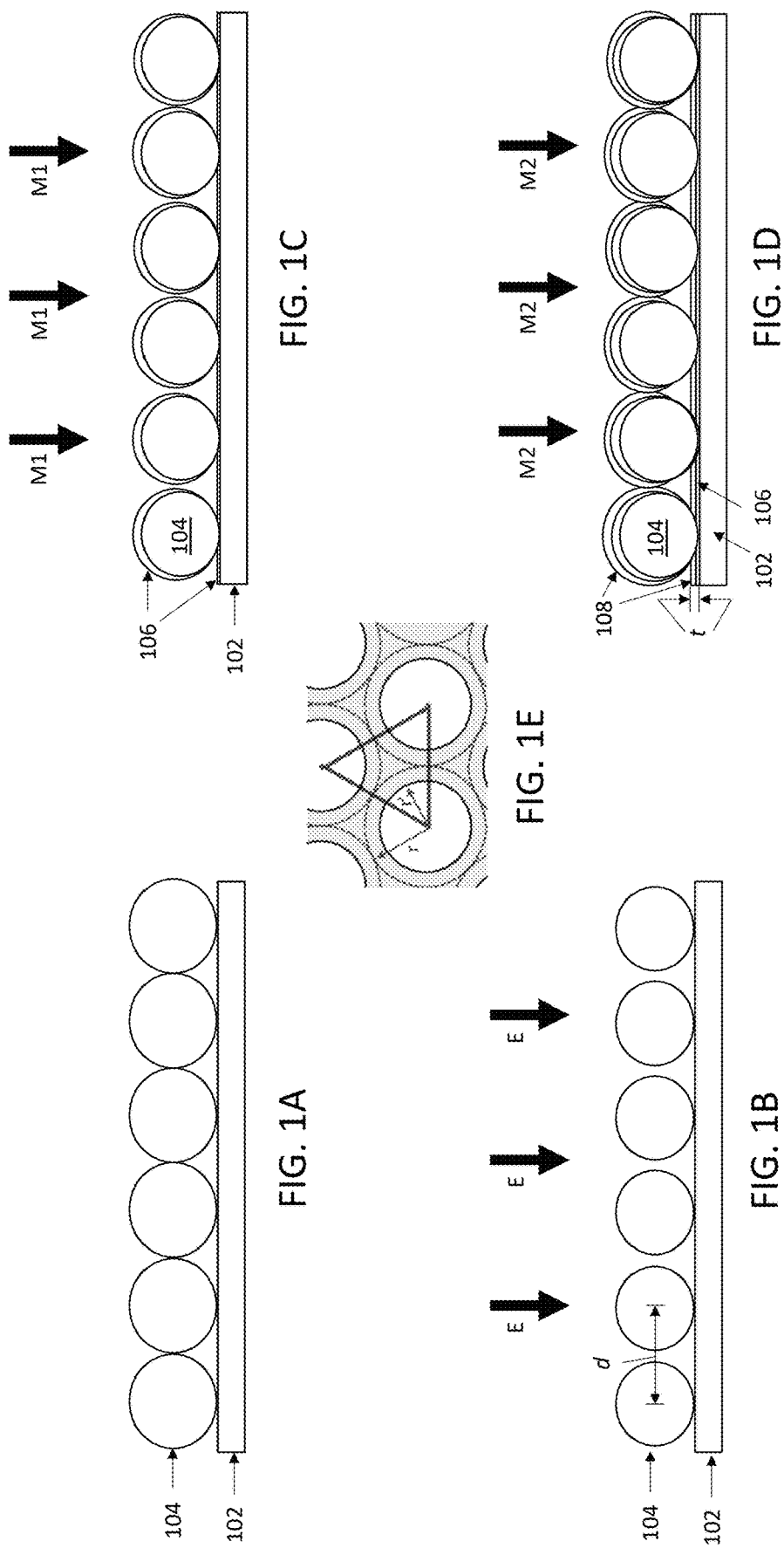

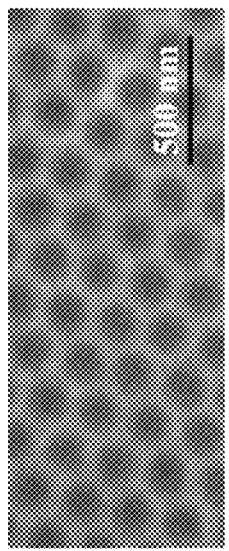
FIG. 2A
FIG. 2B
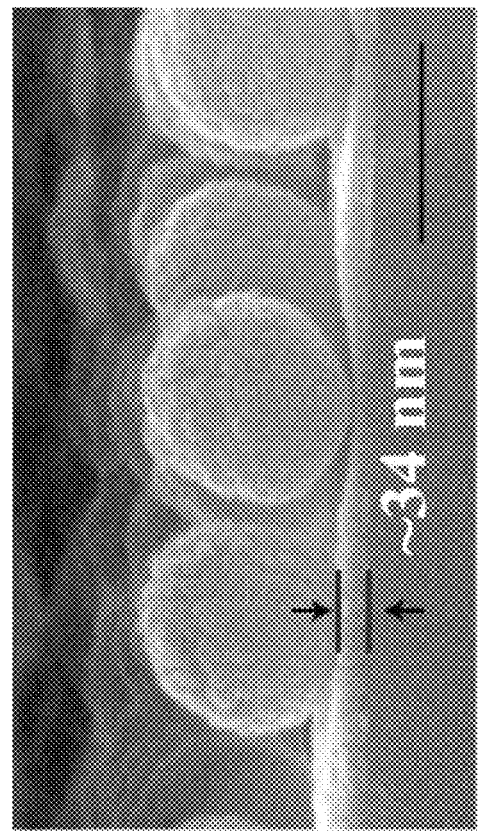
FIG. 2D
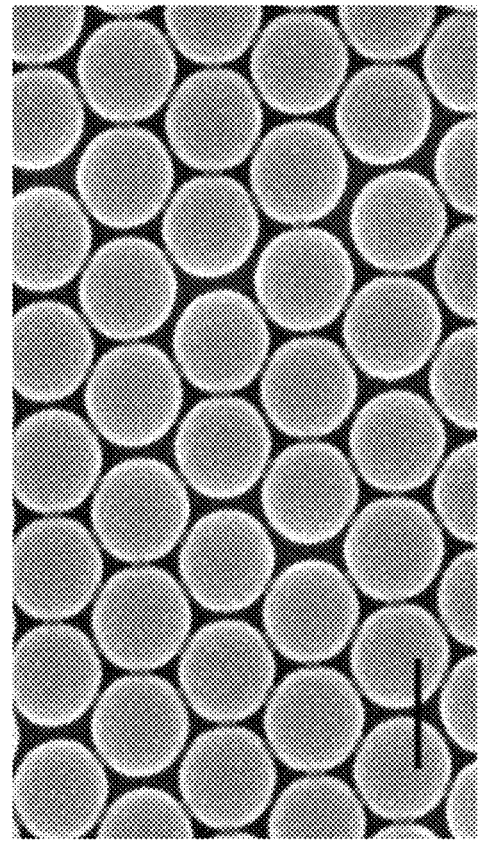
FIG. 2C

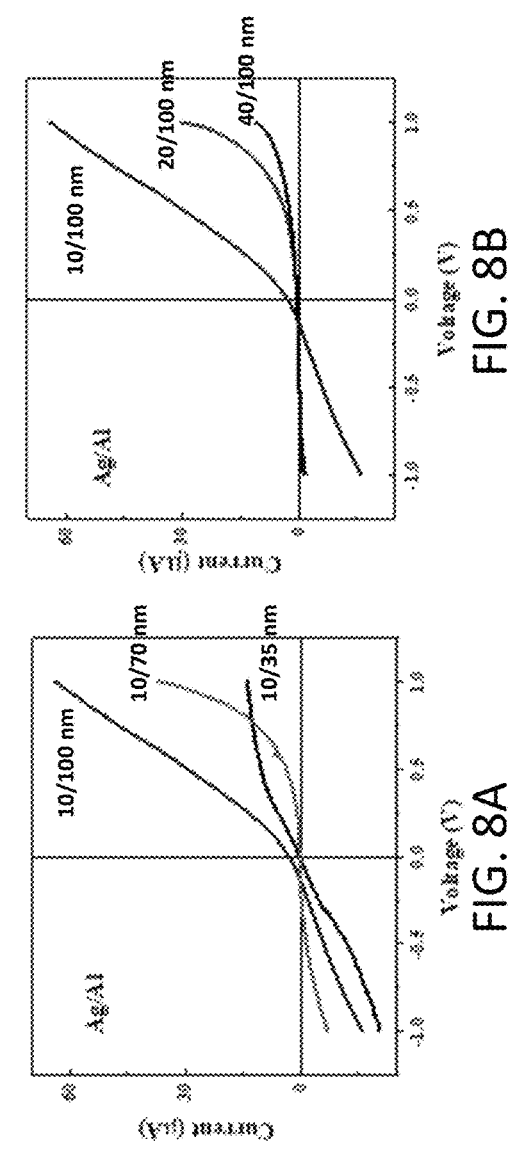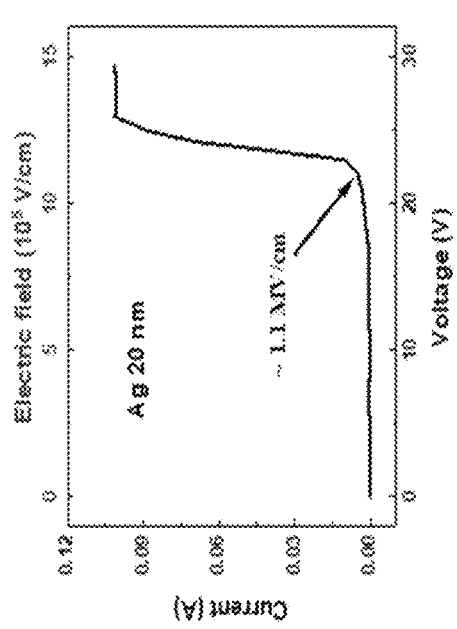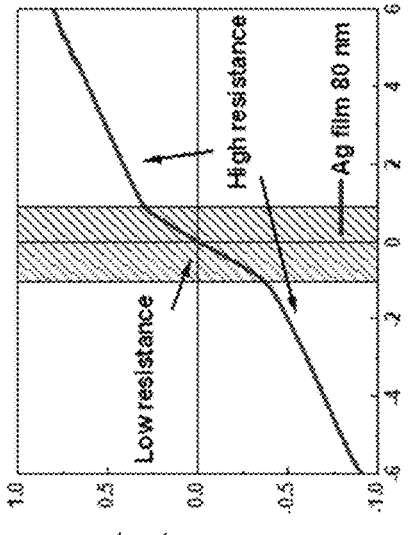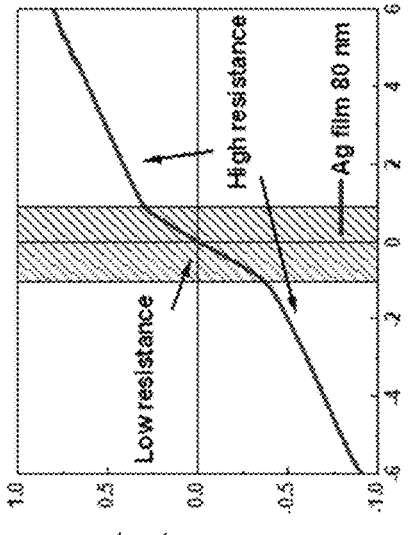
FIG. 8A  FIG. 8B  FIG. 8C  FIG. 9A  FIG. 9B

SUPER-SEMICONDUCTORS BASED ON NANOSTRUCTURED ARRAYS

CROSS REFERENCE TO RELATED APPLICATIONS

This application is a U.S. National Phase Application of International Application No. PCT/US2023/021885, filed on May 11, 2023, titled "SUPER-SEMICONDUCTORS BASED ON NANOSTRUCTURED ARRAYS," the entirety of which is incorporated by reference herein. International Application No. PCT/US2023/021885 claims priority to U.S. Provisional Patent Application No. 63/340,993, filed on May 12, 2022, titled "SUPER-SEMICONDUCTORS BASED ON NANOSTRUCTURED ARRAYS," the entire disclosure of which is incorporated by reference herein.

BACKGROUND OF THE INVENTION

Solid-state electrical conducting materials can be roughly categorized as superconductors, conductors, and semiconductors, depending on their conducting carriers, resistance, and band structures. The discovery of superconductors (Hg, FeSe, YBCO, etc.) has led the resistance to fall by orders of magnitude or even zero under certain extreme conditions, such as an ultra-low temperature or an ultra-high pressure. For semiconductors (Si, GaAs, etc.), both negative charge carriers (electrons) and positive charge carriers (holes) contribute to their conductance, which serves as the foundation of modern electric devices and integrated circuits, but with orders of magnitude higher resistance than metallic conductors. Conventional wisdom holds that electrons are the dominant charge carriers of metallic conductors (Al, Cu, etc.), and holes do not contribute to the excellent conductance of metals because the number of electrons far exceeds the number of holes.

Recent studies of plasmon resonance have shown that the electrons absorb photonic energy that can be ejected from metals to semiconductors at the metal/semiconductor surface when the photonic energy is greater than the Schottky barrier or activation barrier. The photoemission process, in which the energy of an incident photon is used to eject an electron, is a well-studied phenomenon involving hot holes and electrons, in which it is understood that the hot electrons' velocity and mobility are accelerated by obtaining the photon energy.

SUMMARY OF THE INVENTION

One aspect of the invention relates to a super-semiconductor (SSC) comprising a bimetallic nanostructured array including a substrate and a nanoshell array disposed on the substrate. The nanoshell array comprises a plurality of non-close-packed, non-conductive, core bodies disposed on the substrate, a first metal layer disposed on the non-conductive core bodies and on the substrate in areas located between adjacent non-conductive core-bodies, and at least a second metal layer disposed on the first metal layer, wherein the second metal is different than the first metal. The bimetallic nanostructured array exhibits p-type or n-type semiconducting behavior above a transition temperature.

The second metal is preferably a metal that does not form an alloy with the first metal. The first metal may be any metal that has a plasmonic effect induced by infrared photons, such as but not limited to Co, Au, Ag, or any Noble metal. The second metal may be any metal with excellent electrical conductivity, such as but not limited to Al and Cu. As used herein, the term "excellent electrical conductivity" means having a conductivity that is preferably greater than $10 \times 10^6$ S/m, more preferably greater than $20 \times 10^6$ S/m, and most preferably greater than $40 \times 10^6$ S/m. Suitable metals with excellent conductivity include but are not limited to Ag, Cu, Au, Al, Zn, Ni, Ir, Pt, Rh, and Cd. It should be understood that the invention is not limited to use of only "pure" metals. Either or both the first and the second metals may comprise non-alloyed metal mixtures or metal alloys, so long as the respective metal layers preferably otherwise conform to the general properties conducive to creating SSC behavior (i.e. the plasmonic metal layer exhibits a plasmonic effect induced by infrared photons, the conductive metal layer exhibits electrical conductivity above a predetermined threshold, the respective metal layers do not form an alloy with one another at their interface) such that the combination of layers exhibits SSC behavior.

The nanoshell array may include a plurality of (e.g. 2) alternating layers of the first metal and the second metal. The first metal layer may have a thickness that is smaller than (e.g. by an order of magnitude) the second metal layer. In embodiments, the first metal layer may have an average thickness of 5-50 nm in upper hemi-shell regions of the array. The nanoshells may have an inner diameter in a range of 10 to 500 nm, may comprise spheres, and/or may comprise polystyrene (PS), $SiO_2$ or $Al_2O_3$.

In embodiments, the first metal layer may be selected from the group consisting of Co, Au, and Ag, with the second metal layer selected from the group consisting of Cu and Al, with the first metal layer having a thickness that is smaller than the second metal layer, and a total thickness of the first metal layer and the second metal layer in a range of 5-35 nm, with the nanoshells having an inner diameter in a range of 10 to 500 nm In embodiments the substrate may comprise a semiconductor, such as silicon, and may include a conductive layer disposed over a semi-conductive layer.

The transition temperature may be in a range of 210-240 K. In embodiments, the SSC exhibits a resistivity in a range of $10^{-8}$-$10^{-7}$ ohm*m at a temperature of 300 K+/−40K. The p-type metal conductivity may be triggered when a Fermi level difference between the first metal and the second metal is equal to an absorption energy from plasmon resonance of the array.

Another aspect of the invention relates to a semiconductor device comprising the SSC of any of the foregoing claims, such as but not limited to a semiconductor device selected from the group consisting of: diodes, transistors, integrated circuits, integrated circuit chips, power devices, and combinations thereof.

In embodiments, the semiconductor device may comprise a p-n junction diode, wherein the substrate comprises a semi-conductive layer and a metal film disposed on a surface of the semi-conductive layer, in which the p-n junction diode further comprises a first area of the metal film devoid of the nanoshell array; a second area of the metal film on which the nanoshell array is disposed; a first terminal attached to the first area; and a second terminal attached to the second area. A source of a threshold voltage differential may be connected between the first electrode and the second electrode. The metal film in the diode preferably has a thickness selected to minimize a threshold voltage, such as resulting in a threshold voltage in a range from 0.01 V to 0.1 V.

Still another aspect of the invention relates to a method of forming an SSC, the method comprising the steps of: (a) disposing a plurality of core bodies on a substrate in a non-close-packed arrangement; (b) depositing a first metallic layer on the plurality of core bodies and the substrate; and (c) depositing a second metallic layer on the first metallic layer. Steps (b) and (c) may comprise sputtering steps. In embodiments in which the core bodies comprise spheres, step (a) comprises disposing a plurality of the spheres in a close-packed arrangement, and then etching the spheres to reduce the diameters thereof.

BRIEF DESCRIPTION OF THE DRAWINGS

FIG. 1A depicts a schematic side view of an array of microsphere core bodies on a substrate during an exemplary manufacturing process for a semi-superconducting array as described herein.

FIG. 1B depicts the array of FIG. 1A during an etching step.

FIG. 1C depicts the array of FIG. 1B during an exemplary deposition step of a first metal.

FIG. 1D depicts the array of FIG. 1C during an exemplary deposition step of a second metal.

FIG. 1E is a plan view schematic of the geometry of an exemplary array showing the core body radius r/r' without/with etching.

FIG. 2A is a photograph of a scanning electron microscope (SEM) plan view of an exemplary array of spherical core bodies after an etching step.

FIG. 2B is a photograph of a scanning electron microscope (SEM) plan view of an exemplary porous film after removing a bimetallic Co/Al array based on 240 nm PS template.

FIG. 2C is a photograph of an SEM plan view of an exemplary bimetallic array bridges between neighboring spheres, with the black bar denoting 250 nm.

FIG. 2D is a photograph of an SEM cross-sectional or edge view of an exemplary bimetallic array showing an exemplary thickness of ~34 nm for the porous bottom film, with the black bar denoting 250 nm.

FIG. 8A is a graph showing I-V curves for exemplary Ag/Al arrays with a bottom Ag film of 20 nm for different thickness of Al shells, with a constant thickness Ag shell.

FIG. 8B is a graph showing I-V curves for exemplary Ag/Al arrays with a bottom Ag film of 20 nm for different thickness of Ag shells.

FIG. 8C is a graph showing I-V curves of an exemplary Ag/Al array with an Ag film of ~7 nm showing an overlap below 2.2V and assertive voltage-dependent behavior above 2.2V.

FIG. 9A is a graph showing the breakdown field for an exemplary Ag/Al array with an Ag film of 20 nm.

FIG. 9B is a graph showing I-V curve of an exemplary Ag/Al array with an Ag film of ~80 nm, in which the curve exhibits behavior close to a resistor.

DETAILED DESCRIPTION OF THE INVENTION

Figure 3D:
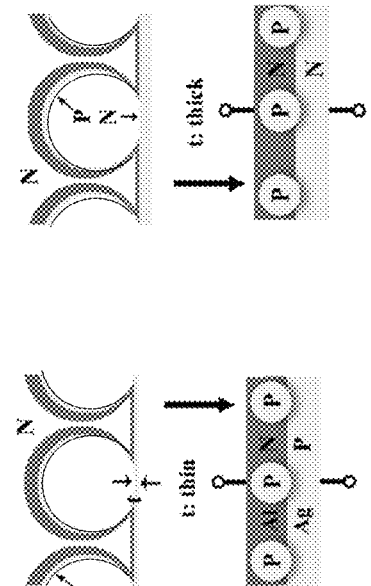
FIG. 3D illustrates a schematic diagram of a p-n junction diode with a thick Ag film.

Disclosed are super-semiconductors (SSCs), whose resistivity is 3-10 orders of magnitude lower than conventional semiconductors (e.g. Si) at room temperature (i.e. at 300K+/−40K). These SSCs exhibit a transition from metal state to SSC state at near room temperatures (>230 K), which is accompanied by an increase of hole carrier density and the mobility increase of electrons. Embodiments of the invention feature a hole-dominated carrier metal in nanostructured bimetallic arrays at near room temperature, with no special conditions required. Hall effect measurements revealed that the decrease of resistivity is due at least in part to the changing of carrier density and mobility, and even the dominant carriers may change from electrons (the n-type charge carriers) to holes (the p-type charge carriers), accompanying the transition from metallic conductors to SSCs. Without being held to any particular theory, it is believed that the observed-SSC transition and p-type metal formation (metal with p-type semiconductor behavior) is caused by the generation of hot electrons and holes induced by metal plasmon resonance in the infrared wavelength range in the nanostructured bimetallic arrays. These results reveal unusual and unexplored properties of nanostructured metals as described herein that empower metals with excellent electrical conductivity while possessing semiconductor features and pave the way to realize ultra-low-power metal-based semiconductor devices, such as diodes, transistors, and integrated circuits.

Exemplary nanostructured bimetallic arrays were fabricated via step-by-step sputtering of two different metals (e.g., Al and Co) on non-close-packed polystyrene sphere (PS) arrays, as shown in FIGS. 1A-1E. In an exemplary process, a plurality of polystyrene (PS) spheres 104 are disposed on a substrate 102, as depicted schematically in FIG. 1A. For example, the spheres may be self-assembled into the array at an air-water interface, as described further in Example 1, below, and then disposed on a silicon substrate. The substrate may be a semiconductor, such as a silicon wafer, or may be a multi-layer substrate, such as a metal layer disposed over a silicon substrate. In the method step illustrated in FIG. 1B, an etching step may be performed to cause the spheres to shrink in outer diameter, while still remaining a set distance (d) apart on center, as discussed further below in Example 1 and as depicted photographically in FIG. 2A. As depicted in FIG. 1E, the etching step reduces the radius of the spheres from r to r1. A first layer 106 of metal M1 is then deposited (i.e. by sputtering) over the etched spheres 104 and the substrate 102, as depicted in FIG. 1C. A second layer 108 of metal M2 is then deposited (i.e. by sputtering) over the first metal layer 106, resulting in a completed bimetal array depicted schematically in FIG. 1D and photographically in FIGS. 2B-2D. While depicted with the core bodies as PS spheres, it should be understood that the core bodies are not limited to a circular geometry or to a PS materials of construction. Preferably, however, the core bodies have insulating, as opposed to conductive properties. For example, insulating oxides such as $SiO_2$ or $Al_2O_3$ may be particularly suitable.

As depicted in FIG. 1E, the gray area is not covered by the spheres, such that the sputtering particles can pass through this region and reach the surface of the bottom film and the bottom of the spheres. Assuming the particles are evenly distributed on the surfaces and the bottom hemispheres of the substrate, the thickness of the bottom hemi-shell is expected to be thinner than on the top hemi-shell.

Figure 13:
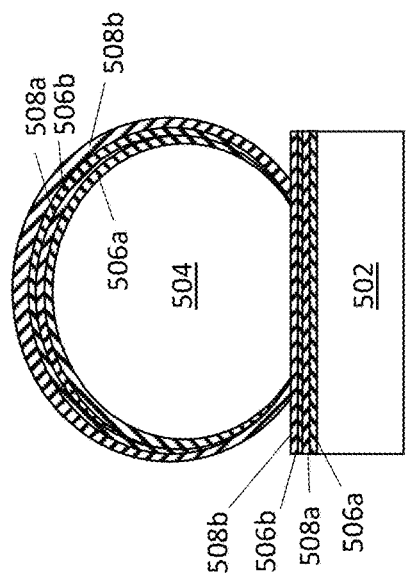
FIG. 13 is a graph showing a schematic illustration of a two-layer bimetallic shell.

While depicted in FIG. 1D as having only 1 layer of each of the two metals, other embodiments may have more than 1 layer of each metal. For example, as depicted in FIG. 13, substrate 502 may have core bodies 504 disposed thereon with a first layer 506a comprising a first (plasmonic) metal (e.g. Co), a second layer 508a comprising a second (conductive) metal (e.g. Al), a third layer comprising a third (plasmonic) metal (which may be a second layer 506b of the first (plasmonic) metal), and a fourth layer comprising a fourth (conductive) metal (which may be a second layer 508b of the second (conductive) metal).

The porous bottom film and bridges between neighboring shells connect the arrays in a hexagonal pattern, as illustrated in FIG. 2C, and the process for making the array enables providing a controllable thickness. The term "porous film," (see FIG. 2B) as described herein, sometimes referred to as a nanoporous film in the academic literature, refers to a film in which the thickness is sufficiently thin such that it is understood by those of skill in the art that some pores (or nanopores) in the film are typically present. Although bridges are depicted as formed between neighboring shells, some embodiments may have fewer than all possible bridges present, some may have no bridges at all, and some may have all possible bridges intact. Exemplary photographs of metal shell structures on the PS arrays are depicted in FIGS. 2B-2D. In one embodiment, Co (a magnetic metal) and Al (a non-magnetic metal with excellent electrical conductivity) were selected for the different metals to facilitate detection of the slight differences in the carrier by anomalous Hall effect (AHE) and ordinary Hall effect (OHE) forces. Differences in respective metal thickness of the metal layers results in respectively different infrared light absorptions.

Figure 6C:
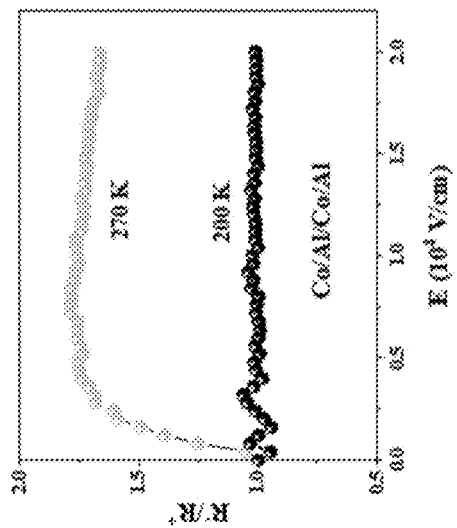
FIG. 6C is a graph showing the rectification effect of a Co/Al/Co/Al array, in which $R^+$ and $R^-$ represent respective resistances to positive and negative electric fields.
Figure 6B:
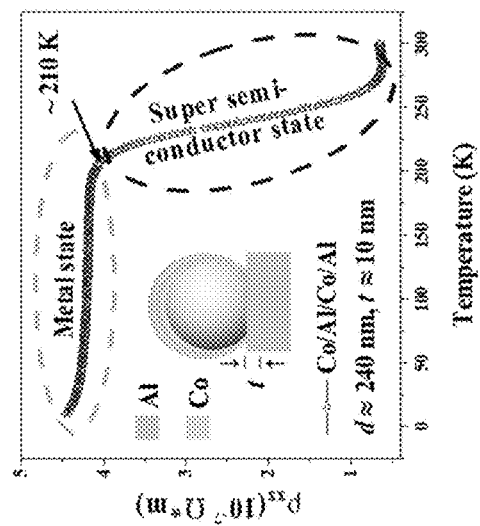
FIG. 6B is a graph showing an R-T curve for a Co/Al/Co/Al array (d=240 nm, t=33 nm) array.
Figure 6A:
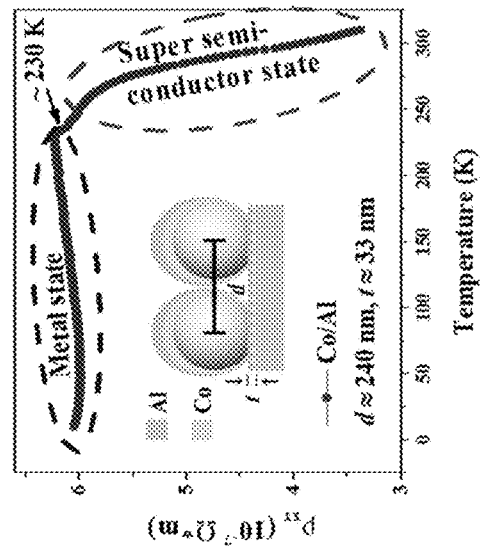
FIG. 6A is a graph showing resistivity as a function of temperature (R-T curve) for a Co/Al (d=240 nm, t=33 nm) array.

FIGS. 6A and 6B show the resistivity as a function of temperature (R-T curve) of Co/Al (d≈240 nm, t≈33 nm) and Co/Al/Co/Al (d≈240 nm, t≈10 nm) arrays, respectively. Nanostructured bimetallic arrays exhibit resistance decreases with temperature, very similar to a typical semiconductor, when above a transition temperature, i.e., ~210-230 K, unlike the typical temperature dependence of metal characteristics (defined as the metal state) for a flat Al film (such as is displayed in the regions below the transition temperatures in both FIGS. 6A and 6B). This state above the transition temperature is referred to herein as the super-semiconductor (SSC) state, whose resistivity near room temperature is much lower than that of the metal state at the transition temperature. The lowest resistivity of the Co/Cu sample (d≈240 nm, t≈6 nm) at 300 K was ~2.4×10$^{-8}$ Ωm, which is 3-10 orders of magnitude lower than that of a conventional semiconductor at room temperature. For comparison, an intrinsic Si is ~$10^2$ Ωm and a heavily doped Si may be improved to ~$10^{-5}$ Ωm.

The transition from a metallic conductor to SSC was observed in various Co/Al arrays (with different total metal thickness dimensions) and Co/Cu arrays as depicted in FIGS. 14A-14E. As shown, the transition temperature varied from 210 to 240 K, depending upon geometry/dimensions. While a transition is observed in Co/Al films as well (not shown), the transition is much less pronounced.

Figure 4A:
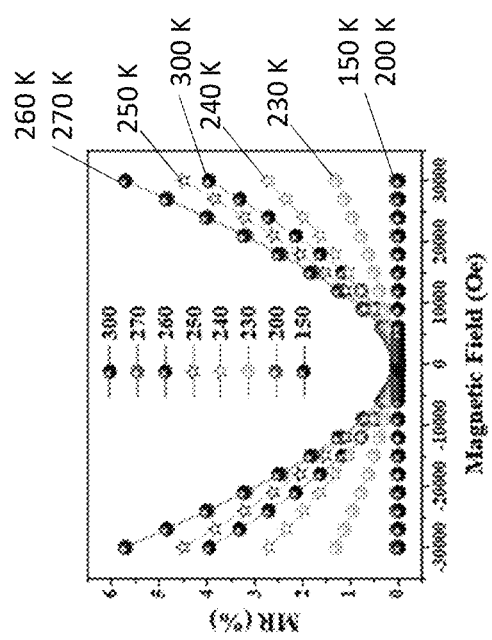
FIG. 4A is a graph illustrating dependence of Hall resistivity at various temperatures for an exemplary Co/Al/Co/Al array.
Figure 4B:
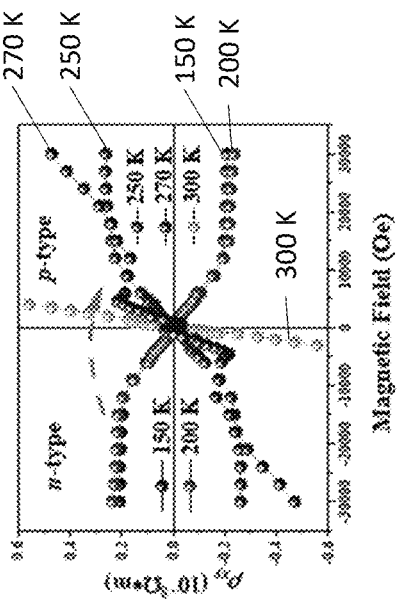
FIG. 4B is a graph showing magnetoresistance (MR) curves at different temperatures for an exemplary Co/Al/Co/Al array.
Figure 4C:
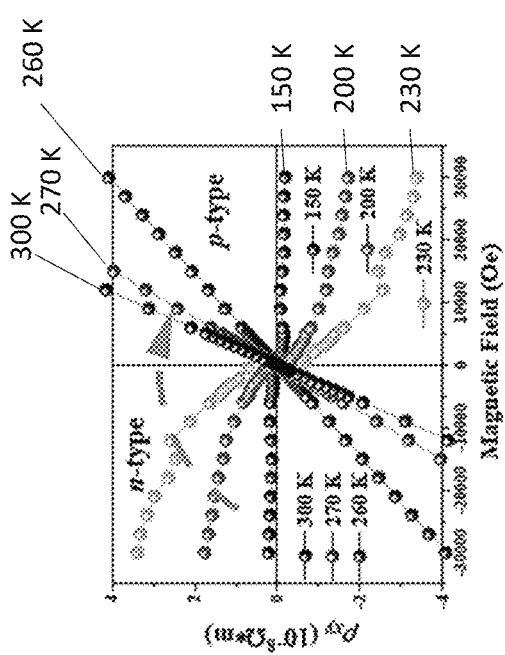
FIG. 4C is a graph showing field dependence of Hall resistivity at various temperatures for an exemplary Co/Al array with d=240 nm and r=9 nm.

The transition from metallic conductor to SSC is mostly accompanied by a dominant carrier shift from electrons (n-type) to holes (p-type) revealed by the exemplary Hall resistance curves of the Co/Al/Co/Al array, taken at different temperatures from 150 to 300 K, as shown in FIG. 4A. A similar carrier type transition is also observed in the Hall resistance curves of the Co/Al sample, shown in FIG. 4C. In addition, as depicted in FIG. 4B, magnetoresistance (MR) also changes greatly along with the transition from metal to SSC, from ~0.4% (at 200 K and 3 T, metal state) to ~5.7% (at 270 K and 3 T, SSC state), an increase of more than 100×, indicating there are both electron and hole carriers in the samples. However, there is also an SSC transition without the dominant carrier shift from electrons to holes. For example, the dominant carriers remain n-type at 300 K for a Co/Al sample (d≈240 nm, t≈10 nm) after the metallic conductor to SSC transition at ~230 K, as shown in FIG. 4C. Without being held to any particular theory, it is believed that when the $R_{200}/R_{300}$ ratio ($R_{200}$=resistance at 200K; $R_{300}$=resistance at 300K) is significant, as shown in Table 1, the SSC becomes p-type. In Table 1, values with asterisks are for the Co/Al/Co/Al sample, whereas all other values are for the Co/Al sample.

TABLE 1

| Samples | d ≈ 240 nm t ≈ 9 nm | d ≈ 240 nm t ≈ 10 nm | d ≈ 240 nm t ≈ 33 nm | d ≈ 150 nm t ≈ 7 nm | d ≈ 150 nm t ≈ 9 nm |
|---|---|---|---|---|---|
| $R_{200}/R_{300}$ | 7.7 | 6.4* 3.1 | 1.9 | 11.9 | 8.1 |
| Carriers' type At 300 K | p-type | p-type* n-type | n-type | p-type | p-type |

Here, * stands for Co/Al/Co/Al sample, $R_{200}$ is the resistance ($R_{xx}$) at 200 K, and $R_{300}$ is the resistance at 300 K.

Figure 5B:
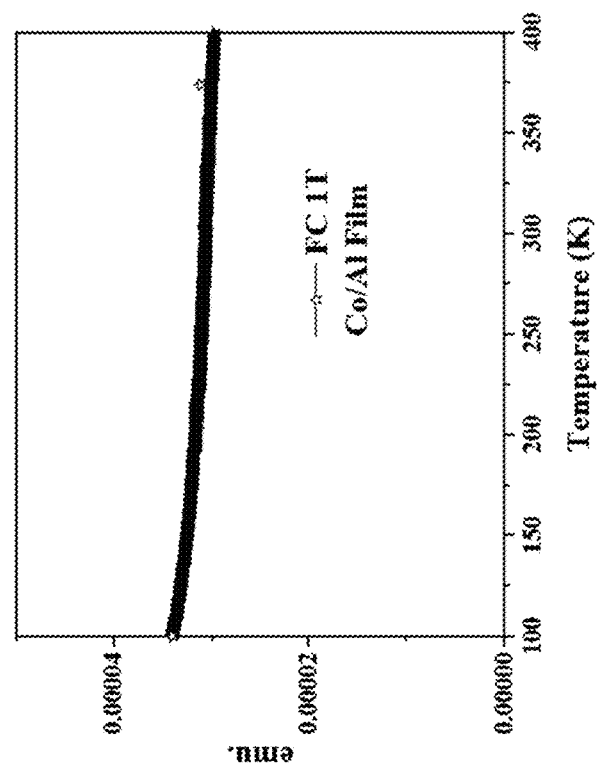
FIG. 5B is a graph showing magnetic properties of an exemplary Co/Al film as a function of temperature.
Figure 5A:
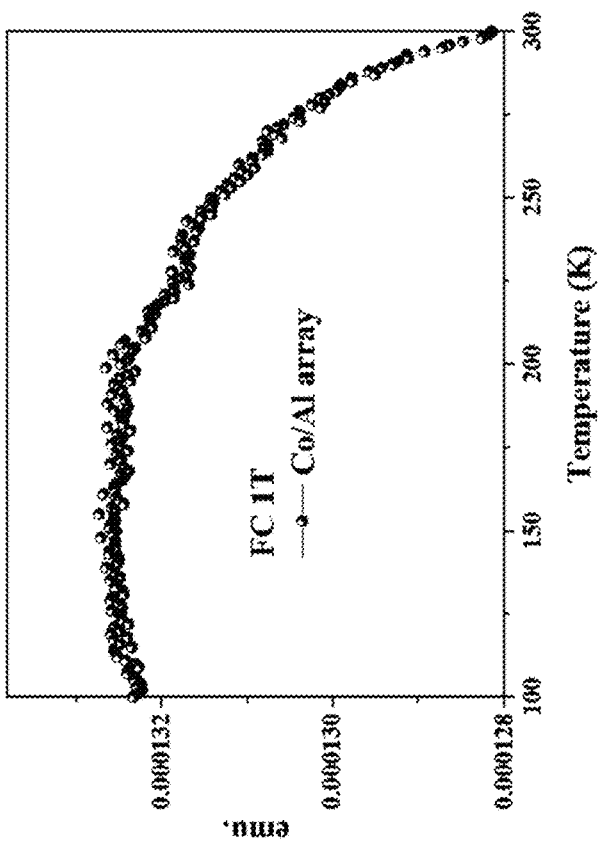
FIG. 5A is a graph showing magnetic properties of an exemplary Co/Al array as a function of temperature.

The magnetization vs. temperature curves of FIGS. 5A and 5B show that the magnetization of the array (FIG. 5A) decreases noticeably above 210 K, while that of the thin film with the same deposition thickness (FIG. 5B) does not significantly change from 100 to 400 K. This indicates that the Curie temperature of the Co/Al sample is beyond the measured temperature range, and the magnetization reduction of the array is closely associated with the SSC transition due to the nanostructural characteristics, but not because of the Curie temperature of the material.

To appropriately evaluate the carrier density and mobility, the Hall conductivity $\sigma_{xy}=-\rho_{xy}/(\rho_{xx}^2+\rho_{xy}^2)$ and the longitudinal conductivity $$\sigma_{xx} = \frac{\rho_{xx}}{\rho_{xx}^2 + \rho_{xy}^2}$$

were calculated using the experimental $\rho_{xy}(H)$ and $\rho_{xx}(H)$ data. Both $\sigma_{xy}$ and $\sigma_{xx}$ data were obtained using the two-carrier model with the same fitting parameters.

$$\sigma_{xy} = \frac{e(\mu_0 H) n_h \mu_h^2}{1+\mu_h^2(\mu_0 H)^2} - \frac{e(\mu_0 H) n_e \mu_e^2}{1+\mu_e^2(\mu_0 H)^2} \quad (1)$$

$$\sigma_{xx} = \frac{en_h \mu_h}{1+\mu_h^2(\mu_0 H)^2} + \frac{en_e \mu_e}{1+\mu_e^2(\mu_0 H)^2} \quad (2)$$

where $n_e(n_h)$ and $\mu_e(\mu_h)$ denote the carrier densities and mobilities of electrons (holes), respectively. The results revealed that the significant reduction of transport resistance due to the metal-SSC transition is mainly caused by the increase of $n_h$ and $\mu_e$. At 150 K, the $n_e$ is estimated ~$1.5*10^{21}$/cm³, which is 7-8 orders of magnitude larger than $n_h$ (~$5*10^{13}$/cm³). With temperature increasing, $n_h$ increases rapidly and exceeds $n_e$ to ~$3*10^{20}$/cm³ at 250 K. Meanwhile, $\mu_e$ also increases greatly, from ~40 (150 K) to ~1400 cm² V⁻¹s⁻¹ (250 K), increased more than 30 times. The improvement of both $n_h$ and $\mu_e$ results in the significant decrease of the bimetallic arrays' resistivity.

Figure 6D:
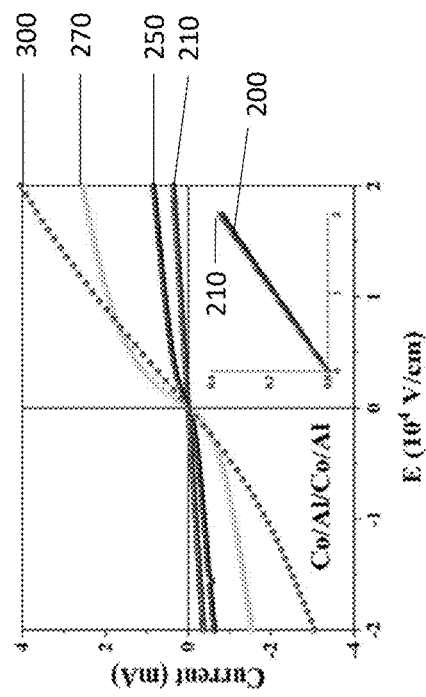
FIG. 6D is a graph showing current vs electric field at different temperatures from 200 to 300 K, with the inset showing a magnification at 200 and 210 K, illustrating the curve overlapping.

In addition to the Hall resistance evidence of the metal-SSC transition, noncentrosymmetric conductor behavior can also demonstrate the hole-dominated semiconductor nature of SSC, which exhibits a rectification effect, i.e., the forward and reverse currents biased under electric field at various temperatures differ from each other. For example, as depicted in FIG. 6D, for the Co/Al/Co/Al sample, at and below 210 K, the nanostructured array remained in the metal state, and the I-V curve obeyed Ohm's law; while above 250 K, the curves deviate from Ohm's law gradually—the higher the temperature, the greater the deviation. Such deviation under the electric field of ~$10^3$-$10^4$ V/cm and similar results from the Co/Al sample (FIG. 6A) resemble semiconductor behavior. Asymmetrical resistances under the positive and negative electric fields were observed. FIG. 6C shows two typical R⁻/R⁺ variations under the electric field at 200 K (in the metal state) and 270 K (in the SSC state). R⁻ is about 1.7 times that of R⁺ at 270 K, suggesting a rectification effect in the SSC state of the p-type metal.

In order to understand the temperature-dependent metal-SSC transition, resistance relaxations of the Co/Al and Co/Al/Co/Al arrays at different temperatures were performed. Below the transition temperature, such as 200 K, the resistance relaxations are very small (<0.06%) and may be neglected, while above the transition temperature, such as 230 K, the resistance relaxations become much larger (>1.0% and approaching 10%). The Co/Al/Co/Al array showed similar trends.

Based upon the knowledge that light (i.e. specific wavelengths of radiation) may cause resistance relaxation in a sample that responds to light, the inventors hypothesized that infrared radiation at ambient temperature may also generate resistance relaxation. To prove this hypothesis, both theoretical calculation and experiments were performed. The theoretical calculation used a finite-difference time-domain (FDTD) method to reveal the plasmon resonance peak corresponding to Co at ~11.2 μm in the Co/Al array. Subsequently, experimental spectra showed an absorption peak at ~11.2 μm. The infrared wavelength peak corresponds to the ambient temperature of ~260 K, according to Wien's displacement law. Without being held to any particular theory, this is believed to explain the unusual increases of $n_h$ and $\mu_e$ in the bimetallic arrays as being caused by the bimetallic arrays' plasmon resonance from infrared radiation from at ambient temperature.

Notably, an absorption peak of ~9.0 μm was also observed, but is believed to be from PSs, independent of SSC, because the infrared wavelength peak at 9.0 μm corresponds to the ambient temperature of ~320 K, according to Wien's displacement law, which is far higher than all the transitions that occur in the range of 210-240 K. Regardless of the absorption peak, the experiment curves are consistent with the FDTD calculation.

To further support the belief that the resistance relaxation was caused by infrared light radiation, I-V curves under direct infrared light radiation were obtained by applying an infrared spectrometer with a wavelength of 1.35-14.28 mm at room temperature. At the same voltage, the current $I_x$ after different exposure times (x=1, 3, 10, and 15 min) to the infrared light was higher than the current without applying infrared light, $I_0$. The normalized current ratios of $I_0/I_x$ of the Co/Al sample stabilized at about 90% after applying higher than 0.1 volts, indicating that the resistance of the sample is reduced by about 10% after exposure to the infrared light. Likewise, the resistance of the Co/Al/Co/Al sample was decreased by about 30% after exposure to infrared light. It is understood that the resistance relaxation is dependent on the intensity of the excitation light: the stronger the infrared light, the shorter period of the relaxation to reach equilibrium. Therefore, compared with ambient thermal infrared, the resistance relaxation in the I-V curves under direct light radiation reach equilibrium faster.

Moreover, a correlation between the transition and intensity of the light absorption was observed. The intensity of the light absorption of the Co/Al array was found to be ~2-3 times that of the Co/Al bilayer films, indicating that the nanostructured array can enhance light absorption, consistent with the FDTD calculation. In addition, an increase in Co thickness of bilayer films leads to a decrease in light absorption and results in the transition in RT curves being less pronounced. This is consistent with the results of the Co/Al arrays. The stronger the light absorption, the more significant the transition from metal state to SSC state.

Further, based on the relationship between plasmon resonance frequency and electron density, one can estimate electron density at different temperatures from Co's absorption spectra in the Co/Al array based on the following equation:

$$f = \frac{e}{2\pi}\sqrt{\frac{n_e}{m\varepsilon_0}} \quad (3)$$

Where the f is the frequency of plasmon, m and e are the electron mass and charge, respectively, and $\varepsilon_0$ is the permittivity of free space. Consider the relationship between wavelength and frequency, Eq. (3) can be rewritten as:

$$\lambda\sqrt{n_e} = C \quad (4)$$

Here, C is a constant. Taking $\lambda_1=11.18$ μm, $\lambda_2=11.07$ μm, and $\lambda_3=11.06$ μm into Eq. (4), the $n_{e1}$ and $n_{e2}$ are at about 97.9% and 99.8% the value of $n_{e3}$. Where, $\lambda_1$, $\lambda_2$ and $\lambda_3$ are the Co plasmon peaks at 300, 200, and 100 K, respectively; $n_{e1}$, $n_{e2}$, and $n_{e3}$ are the electron densities of Co at 300, 200, and 100 K, respectively. At 300 K, the free electron density is only 97.9% of that at 100 K, while it is ~99.8% at 200 K, however, no such density change was observed in the pure Co array, indicating that at least ~2% of electrons are hot electrons ejected from Co to Al by absorbing infrared photon energy at 300 K. Furthermore, the bandgap of the bimetallic array is estimated to be ~0.14-0.15 eV based on the infrared light absorption spectra.

Figure 7:
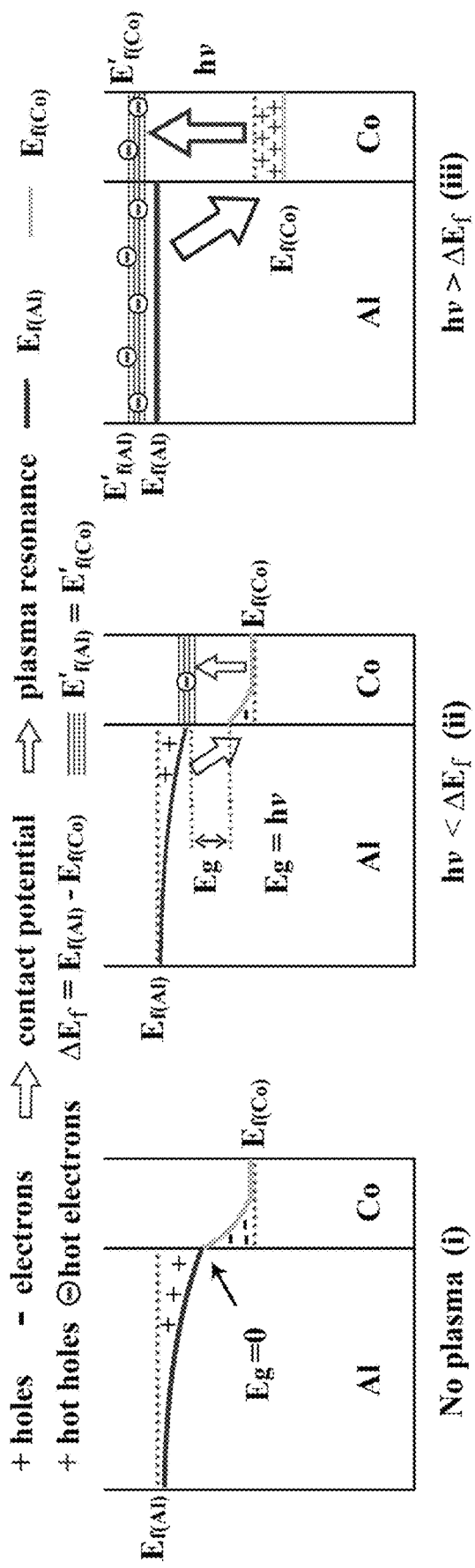
FIG. 7 is a schematic illustrating the plasma resonance mechanism of the bimetallic arrays, where $E_{f(Al)}$ and $E_{f(Co)}$ are the Fermi levels of the free electrons of Al and Co, respectively, and $E'_{f(Al)}$ and $E'_{f(Co)}$ are an energy band of hot electrons with a series of energy levels.

The hot electrons injected from Co to Al in the Co/Al arrays are driven by the work function difference between the two components. Although the work function of the Co film (4.37 eV) characterized using the ultraviolet photoelectron spectroscopy is higher than that of the Al film (4.22 eV), the work function becomes 4.07 eV for the Co array, proving that the plasmonic effect would prompt the Fermi energy level of the Co array higher than that of the Al film, resulting in the injection of hot electrons from Co to Al. The bandgap of ~0.14–0.15 eV obtained from the infrared light absorption spectra is well matched by the transportation activation energy above the transition temperature, ~0.11±0.02 eV, obtained from R-T curve fittings. This indicated that when the energy of Fermi level difference between the two metals is equal to the infrared absorption energy from plasmon resonance of the array, the metal-SSC transition will be triggered. Schematics of the plasma resonance mechanism of the bimetallic arrays are depicted in FIG. 7. $E_{f(Al)}$ and $E_{f(Co)}$ are the Fermi levels of the free electrons of Al and Co, respectively, while $E'_{f(Al)}$ and $E'_{f(Co)}$ are an energy band of hot electrons with a series of energy levels.

Experimental results were supported by simulations based on the density functional theory (DFT). The density of state (DOS), the Bader charge distribution across the Al—Co interface, and work function of the Co/Al structure were calculated based on a unit cell model of the amorphous Co/Al structure. A Hubbard U correction (DFT+U) was applied with a U value of 3.42 eV to simulate the plasmon effect. The DOS calculation showed that the d orbital of Co determines the total DOS of the Co/Al structure, and the calculated work functions are consistent with experimental results. In addition, the Bader charge distribution at the Al—Co interface indicated that charge carriers were dominated by holes in Co and electrons in Al, implying the formation of hot electrons and holes by the plasmonic effect.

Based on the experimental and simulation results, the band structure of SSC can be briefly characterized. Below the transition temperature, i.e., 200 K, the plasmon resonance of Co is very weak, and few hot electrons can obtain enough energy to overcome the energy barrier. Thus, free electrons will dominate the transport. However, when the temperature is above the transition, for example close to 260K, a large number of free electrons in Co will gain higher kinetic energy and mobility by absorbing photon energy and become hot electrons via plasmon resonances, resulting in hot electrons entering Al and the formation of hot holes in the Co. Compared to free electrons, hot carriers with higher energy are closer to the Fermi surface; thus, the transport current will gradually be dominated by the recombination of hot electrons and holes instead of the flow of free electrons.

In addition, along with the semiconductor properties in the bimetallic arrays, the mass of the electrons may change to be the effective mass, which is less than that of free electrons, according to semiconductor theory and is helpful for increasing the mobility of hot electrons. Moreover, the momentum of hot electrons is far larger than that of free electrons, which may enhance the coupling between the orbital and spin of electrons. The potential enhanced spin-orbital coupling may allow electrons to gain a very high mobility, leading to the SSC effect.

In summary, a metal-SSC transition was observed in the exemplary nanostructured Co/Al arrays as described herein. The transition was accompanied mainly by the shift of dominant charge carriers from free electrons to hot electrons and holes induced by plasmon resonance under infrared radiation when the energy of Fermi level difference between the two metals matches that of the plasmon resonance light absorption of the array. Infrared light at ambient temperature is capable of triggering the metal-SSC transition without additional energy sources. SSC conductors with significantly low resistivity and semiconducting behavior may be incorporated in metal-based, ultra-low-power, SSC devices, such as diodes and transistors as well as integrated circuits. As used herein, the term "infrared light" should be understood to refer to infrared radiation at a wavelength that produces infrared photons, wherein the term "light" is not intended to refer to radiation in the spectrum visible to humans.

Due to the high resistance of semiconductors, the problem of power consumption of semiconductor devices, i.e., chips, becomes more and more serious with the performance improvement. A conventional semiconductor such as silicon has a resistivity from ~$10^2$ ohm*m (intrinsic) to ~$10^{-5}$ ohm*m (heavily doped). Embodiments of the present invention include nanostructured (e.g. Co/Al) bimetallic arrays with an unparallel resistivity of ~$10^{-8}$ ohm*m that show semiconductor behavior with 3-10 orders of magnitude lower resistivity than that of a conventional semiconductor (i.e., Si). SSC based electronic devices, such as diodes, transistors, integrated circuits, and chips, are expected to significantly reduce the power consumption and enable superior device performance.

Semiconductor Devices with SSCs

The realization of SSCs, as discussed above, also facilitates the realization of ultra-low-power semiconductor devices. Unlike graphene, whose bandgap is zero, the bandgap of SSCs is approximately equal to the photon energy of thermal infrared, which endows ultra-low-power semiconductor devices with a naturally optimal design. Moreover, better than graphene and carbon nanotubes, SSCs can be fabricated in diversiform periodic patterns with large areas via colloidal lithograph, which is beneficial to the large-scale manufacturing of nanodevices.

Semiconductor p-n junctions are the primary building blocks of many electronic devices, such as transistors, integrated circuits, chips, solar cells, and photodetectors. The power consumption of p-n junction diodes depends on their threshold voltage: the lower the threshold voltage, the lower the power consumption. Described below are exemplary SSC p-n junction diodes comprising Ag/Al arrays, with a threshold voltage that is tunable by modifying the thickness of the bottom Ag film. A near zero-threshold voltage may be achieved with an Ag film of ~20 nm, which results in ultra-low-power p-n junction diodes: ~3 W per trillion diodes with a working voltage of 1 V, or ~30 mW per trillion diodes with an operating voltage of 0.1 V.

Furthermore, a built-in electric field in the SSC p-n junction is generated by infrared light photons, resulting in a high breakdown field of ~$1.1 \times 10^6$ V/cm, the same order of magnitude with wide bandgap materials such as SiC ($2.5 \times 10^6$ V/cm) and GaN ($2.9 \times 10^6$ V/cm), much higher than that of Si-based materials ($3.0 \times 10^5$ V/cm). The SSC p-n diodes with near zero-threshold voltage, as well as the high breakdown electric field, may be incorporated into ultra-low-power semiconducting transistors, integrated circuits, and chips.

Figure 3F:
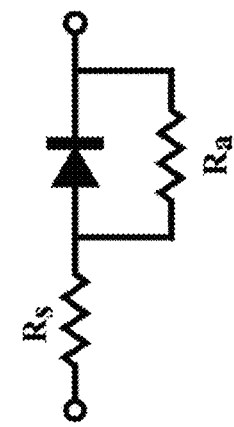
FIG. 3F schematically illustrates an equivalent circuit of a p-n junction diode in which $R_s$ is the series resistance of the bottom metal film and $R_a$ is the resistance of the parallel resistor of the array.
Figure 3C:
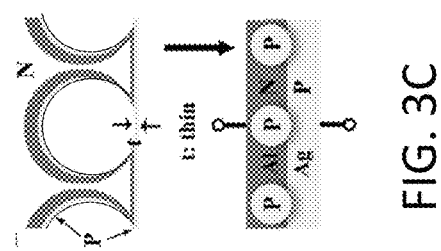
FIG. 3C illustrates a schematic diagram of a p-n junction diode with a thin Ag film.
Figure 3E:
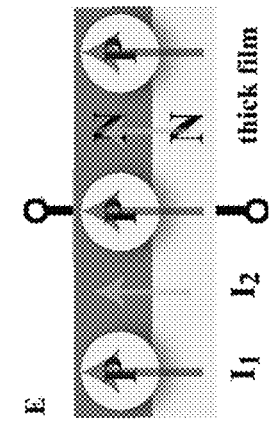
FIG. 3E illustrates a schematic diagram of a p-n junction diode with a thick Ag film showing constituents of the current conducted therethrough, with $I_1$ being the current passing through the p-n junction and $I_2$ being the current passing through the parallel resistor connecting two n-type metallic layers.
Figure 3A:
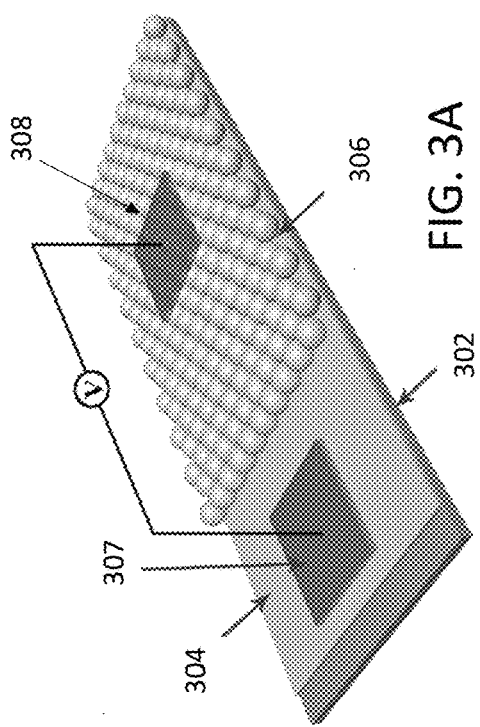
FIG. 3A depicts a schematic perspective view of an exemplary p-n junction diode according to an aspect of the invention.

An exemplary embodiment, formed as an exemplary measurement setup for an exemplary p-n junction, is illustrated in FIG. 3A. A metal film (e.g. Ag) 304 is first deposited on a substrate (e.g., intrinsic silicon) 302, and a bi-layer Ag/Al shell array 308 comprising non-close-packed polystyrene spheres (PS) templates are then structured on the film. The bottom porous film and the bridges between neighboring PSs connect the shells in the array with a hexagonal pattern and controllable thickness. Two conductive (e.g. indium) plates 307, 308 are respectively disposed on top of the Ag/Al shell array (308) and on the Ag film (307). Each of the electrodes covers a contact area of about 1 $mm^2$.

The rectifying current-voltage (I-V) curves of bi-layer Ag/Al shell arrays with different Ag(Al) layer thicknesses are shown in FIGS. 8A and 8B. The bottom metal film is designed to avoid the effect of Schottky contact between the metal shell arrays and the Si wafer, and the Ag/Al array with a thickness of 10/100 nm was chosen due to better-rectifying behavior.

Figure 10A:
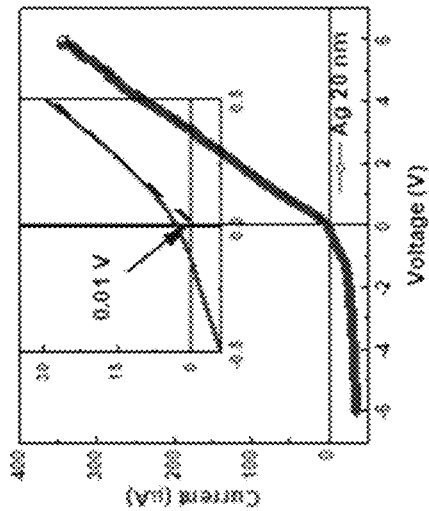
FIG. 10A is a graph showing an I-V curve of an Ag/Al array with an Ag film of ~20 nm, with an inset curve showing magnification of the curve close to zero bias.

FIG. 10A illustrates a typical rectifying I-V curve of the SSC p-n junction diode featuring unidirectionally conducting with a forward guide and reverse cutoff. The inset is the magnification of the I-V curve close to zero bias. It should be noted that the current and voltage are linearly related in forwarding conduction. The inset shows a near zero-threshold voltage (~0.01 V) when the Ag film is ~20 nm, indicating that ultra-low-power p-n junction diodes may be realized by significantly reducing the working voltage. For example, the power consumption would be ~3 W per trillion diodes with a working voltage of 1 V, while with an operating voltage of 0.1 V, the power consumption would reduce by two orders of magnitude to ~30 mW per trillion diodes. As depicted, the diode density is ~$2 \times 10^7/mm^2$.

Different from traditional p-n junction diodes, the rectifying I-V curves (depicted in FIG. 11A) show that the slope of the forward I-V curves will decrease with increasing maximum initial voltage when the voltage is above 3 V. FIG. 9A (illustrating the breakdown field of an Ag/Al array with an Ag film of ~20 nm) shows that the reverse breakdown field is ~1.1 MV/cm (average value of 5 samples), similar to that of SiC and GaN. Similarly, the voltage-dependent I-V curves up to 20 V (~1.0 MV/cm electric field) without breakdown are observed in the Ag/Al array with ~7 nm thick Ag film, as depicted in FIG. 8C. As shown in FIG. 8C, below 2.2 V, all the I-V curves overlap. Above 2.2 V, the curves show assertive voltage-dependent behavior, which is different from traditional semiconductor p-n diodes. Here, the reverse field with up to ~$1 \times 10^6$ V/cm not yet reaches the breakdown field.

Figure 11B:
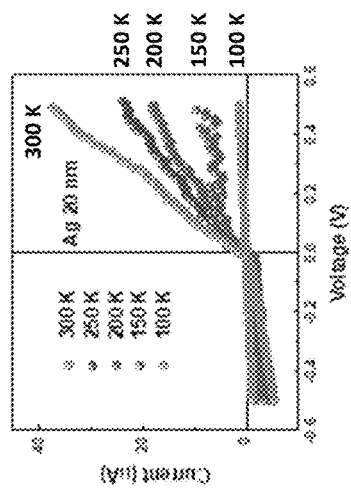
FIG. 11B is a graph showing temperature dependent I-V curves for an SSC p-n junction diode with an Ag film of ~20 nm.
Figure 11A:
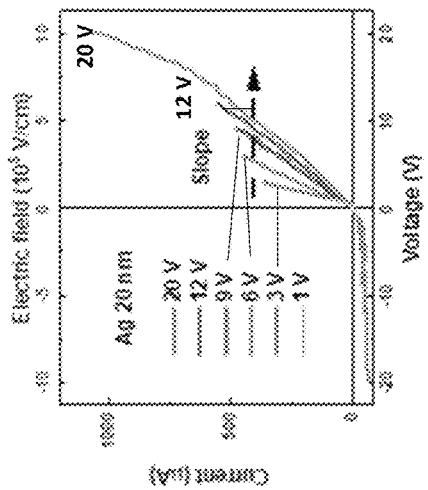
FIG. 11A is a graph showing voltage dependent I-V curves for an SSC p-n junction diode with an Ag film of ~20 nm.

The I-V curves at different temperatures reveal that the rectification effect can be observed when the temperature is above 150 K. No rectification effect is noticed at 100 K, indicating that the bi-layer shell array is still in its metal state. However, the rectification effect becomes increasingly apparent with increasing temperature from 150 to 300 K, as depicted in FIG. 11B. Similar temperature-dependent I-V curves were observed for Ag/Al arrays on an Ag film of ~10 nm.

Figure 10B:
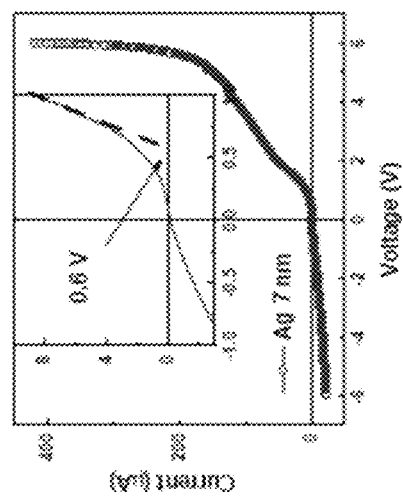
FIG. 10B is a graph showing an I-V curve of an Ag/Al array with an Ag film of ~7 nm, with an inset curve showing magnification of the curve close to zero bias.
Figure 10C:
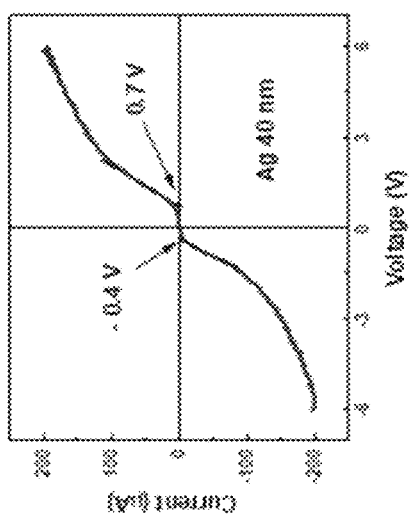
FIG. 10C is a graph showing an I-V curve of an Ag/Al array with an Ag film of 40 nm, showing an approximate centrosymmetric geometry with positive/negative threshold voltages of 0.7/0.4 V.
Figure 10D:
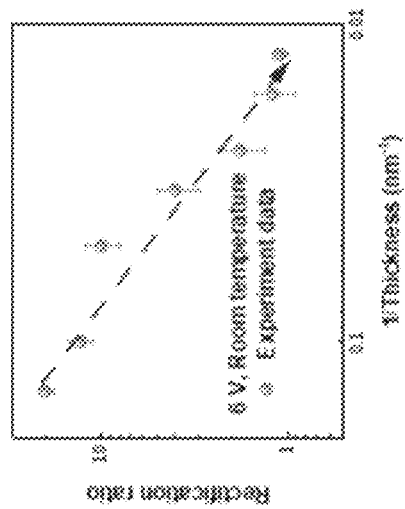
FIG. 10D is a graph showing the rectification ratio of SSC p-n junction diodes for different Ag film thicknesses.

Two typical I-V curves with different Ag film thicknesses are shown in FIGS. 10A and 10B to illustrate an exemplary way in which to achieve near-zero threshold voltage. The I-V curve depicted in FIG. 10B for an Ag/Al array with an Ag film of ~7 nm shows a more substantial rectification effect than that depicted in FIG. 10A for the Ag film of 20 nm; yet, the threshold voltage is about 0.6 V, far higher than that for an Ag film of 20 nm. When the Ag film is thicker than 20 nm (e.g., 40 nm), the reverse cutoff of the I-V curve disappears, and an approximate centrosymmetric I-V curve with positive/negative threshold voltages of 0.7/−0.4 V is observed, as illustrated in FIG. 10C. As depicted in FIG. 10C, two threshold voltages can be seen clearly under the forward and reverse bias. As depicted in FIG. 10D, the rectification ratio of SSC p-n junction diodes with different Ag film thicknesses shows that the rectification ratio shows an approximately inverse linear relationship to the film thickness.

FIG. 9B reveals that the I-V curve deviates from a typical p-n junction diode behavior and is closer to the behavior of a pure metallic resistor when the Ag film increases to ~80 nm. The film-thickness-dependent I-V curves indicate the presence of not only a forward p-n junction diode, but also a reverse p-n junction diode, which becomes more substantial along with the thickness increase until the unidirectionally conducting behavior of the array disappears. This near zero-threshold voltage is achievable and has been observed in bi-layer shell arrays comprising other metals, such as in Au/Al arrays having a bottom Au film of 10 nm.

Figure 12B:
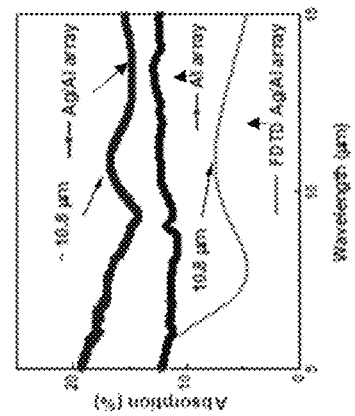
FIG. 12B is a graph showing absorptions of Ag/Al and Al arrays measured at room temperature simulated using the FDTD method.
Figure 12A:
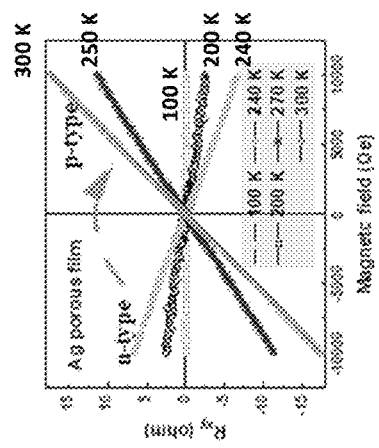
FIG. 12A is a graph showing Hall curves for an Ag porous array with an Ag film of 10 nm at different temperatures.
Figure 14A:
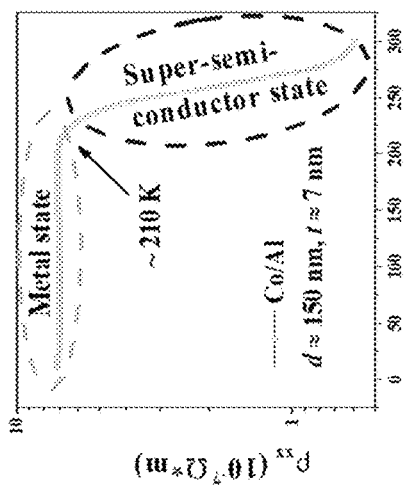
FIG. 14A is a graph showing an R-T curve for a Co/Al (d=240 nm, r=9 nm) array.
Figure 14B:
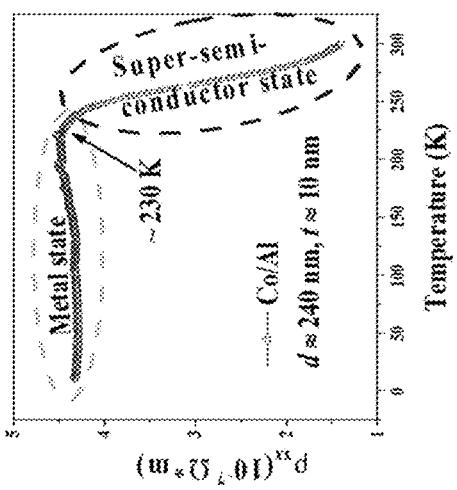
FIG. 14B is a graph showing an R-T curve for a Co/Al (d=240 nm, t=10 nm) array.
Figure 14C:
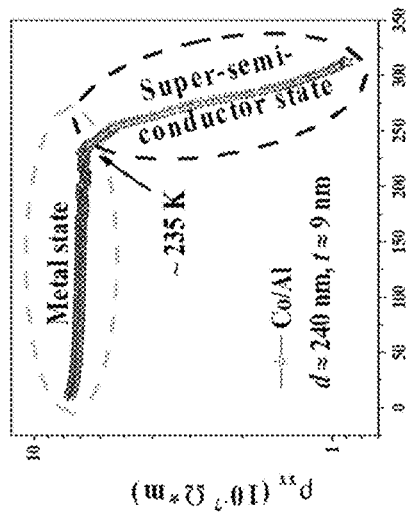
FIG. 14C is a graph showing an R-T curve for a Co/Al (d=150 nm, t=7 nm) array.
Figure 14D:
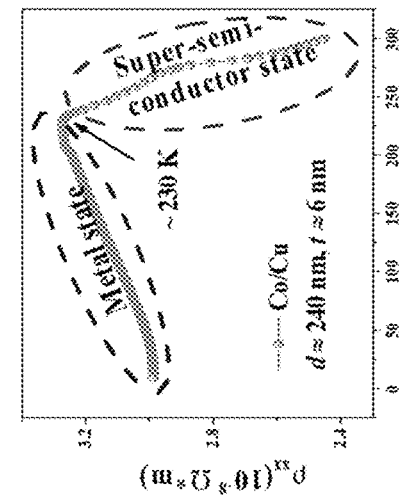
FIG. 14D is a graph showing an R-T curve for a Co/Al (d=150 nm, t=9 nm) array.
Figure 14E:
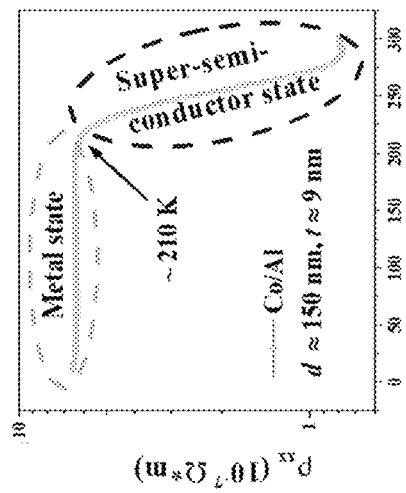
FIG. 14E is a graph showing an R-T curve for a Co/Cu (d=150 nm, t=6 nm) array.

Hall effect measurements at different temperatures reveal that the dominant charge carrier type of the Ag shell arrays with an Ag film of 10 nm shifts from n-type to p-type with the temperature increase from 100 to 300 K, as depicted in FIG. 12A. This is consistent with the temperature-dependent I-V curves of the SSC p-n junction diodes as discussed above. Both experimental results and theoretical calculations using a finite-difference time-domain (FDTD) method reveal a plasmonic resonance peak of the Ag/Al array at ~10.8 µm (or ~0.11 eV, FIG. 4B), which generates hot charge carriers, including electrons and holes that dominate the electrical transport and result in the SSC behavior. According to Wien's displacement law, the infrared wavelength peak corresponds to an ambient temperature of ~270 K, which offers an explanation for the temperature-dependent I-V curves of the p-n junction diodes caused by the bi-layer shell arrays' plasmon resonance under the infrared light radiation from the ambient temperature.

The light absorption of Ag shell arrays on different Ag thicknesses shows that when the Ag film is 10 nm thick, the light absorption is robust, indicating that the Ag film and Ag shells share plasmon resonance. However, with an increase of the Ag film thickness, the light absorption intensity decreases drastically from ~58% for 10 nm to ~4% for 40 nm, demonstrating a significant decrease of the plasmon resonance with the increase of Ag film thickness.

FIG. 12A depicts the Hall curves of an Ag porous array with an Ag film of 10 nm at different temperatures. FIG. 12B shows the absorptions of Ag/Al and Al arrays measured at room temperature, with a simulation curve calculated by using the FDTD method.

Figure 3B:
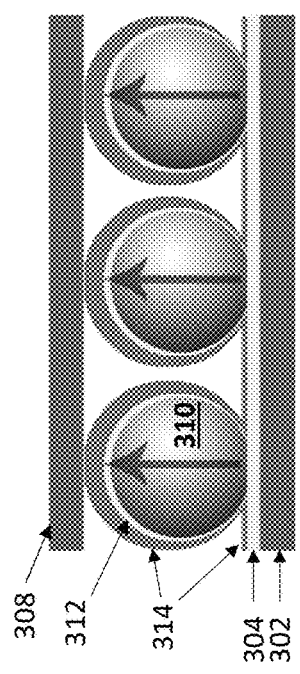
FIG. 3B illustrates a schematic cross-sectional view of the microstructure of the SSC array portion of p-n junction diode of FIG. 3A, with an electric field.

FIG. 3B illustrates the schematic microstructure of the p-n junction diode with a built-in electric field, wherein the top and bottom (e.g. Indium) films denote electrodes. FIG. 3C and FIG. 3D are schematic diagrams of p-n junction diodes with thin and thick Ag films respectively. The presence of the PS structures enhances light absorption. In FIGS. 3C and 3D, P and N stand for p- and n-type metals, respectively; t is the thickness of the bottom film. FIG. 3E illustrates current constituents flowing inside the array with a thick Ag film. $I_1$ is the current passing through the p-n junction, and $I_2$ passes through the parallel resistor connecting two n-type metallic layers. FIG. 3F illustrates an equivalent circuit of the p-n junction diodes. $R_s$ is the series resistance of the bottom Ag film, and $R_a$ is the resistance of the parallel resistor in FIG. 3E.

A schematic microstructure of the p-n junction diode with a built-in electric field is shown in FIG. 3B, and a schematic diagram of p-n junction diodes with different Ag film thicknesses is demonstrated in FIGS. 3C and 3D. Here, the Ag shells hold p-type charge carriers, and the Al shells are with n-type carriers. For a thin Ag film (FIG. 3C), a granular film (e.g. a granular film of 10 nm Ag) will also generate plasmon resonance as the Ag shells, there is only one p-n junction diode with the Al shells holding n-type charge carries while the Ag shells and bottom thin film bearing p-type charge carries.

However, for the thick Ag film, i.e., ≥20 nm, which becomes a flat film that fates the plasmon resonance and is dominated by n-type carriers (FIG. 3D), the current flow through the array can be divided into two parts in the thick film when an external electric field is applied: one is the current flowing across the p-n junction diodes ($I_1$), and the other is the current passing through the parallel resistor ($I_2$), see FIG. 3E. For the current $I_1$ channel, two p-n junction diodes co-exist, the primary p-n diode (forward) and a reverse p-n diode, i.e., n-p-n diodes in series. Hence, a nearly centrosymmetric I-V curve with two threshold voltages could be observed in the thick film (i.e., as depicted in FIG. 10C).

For the convenience of the analysis, we only discuss the primary p-n junction diode. The current flowing across a p-n junction diode can be expressed by the ideal diode equation:

$$I = I_0\left(\exp\left(\frac{qV}{nk_BT}\right) - 1\right) \quad (5)$$

where $I_0$ is the reverse saturation current, n is the ideality factor, and $k_B$ is the Boltzmann constant. For an ideal diode, n=1 indicates that the diffusion current plays a dominant role, n=2 suggests that the recombination current plays a dominant position, and n>2 implies non-ideal diodes. Considering the resistance of the bottom Ag film, the equivalent circuit of SSC p-n junction diodes can be schematically shown in FIG. 3F and eq. (5) can be rewritten as:

$$I = I_1 + I_2 = I_0\left(\exp\left(\frac{q(V - IR_s - V_b)}{nk_BT}\right) - 1\right) + (V - V_b - IR_s)/R_a \quad (6)$$

Here, $$I_1 = I_0\left(\exp\left(\frac{q(V - IR_s - V_b)}{nk_BT}\right) - 1\right), I_2 = (V - V_b - IR_s)/Ra,$$

and $V_b$ is the bias caused by the formation of hot charge carriers due to the plasmon resonance. When the bottom Ag film thickness is very thin, such as 7 or 10 nm, the resistance of the granular film is very high, about 3 and 0.5 MΩ respectively. Therefore, the series resistance of the bottom Ag film cannot be ignored. However, when the Ag thickness is ≥20 nm, it becomes a continuous flat film and its resistance dramatically reduces ≤~40Ω, thus, the series resistance is negligible, and eq. (6) can be simplified as:

$$I = I_0\left(\exp\left(\frac{q(V - V_b)}{nk_BT}\right) - 1\right) + (V - V_b)/R_a \quad (7)$$

Based on Eqs. (6) and (7), a set of fitting data of ideality factors with different Ag thicknesses are shown in Table 2.

TABLE 2

Ideality factor and rate of contribution of I2 with different Ag film thickness at room temperature.

| Thickness (nm) | n | α (%) |
|---|---|---|
| 7 | 2.3 | 14 |
| 10 | 3.4 | 20 |
| 20 | 7.6 | 30 |
| 30 | 102 | 33 |
| 40 | 354 | 40 |

Here, $\alpha = I_2/I$ indicates the proportion of the current not passing the diode to the total current.

With increasing the Ag film thickness from 7 to 20 nm, the ideality factor n monotonously increases from 2.3 to 7.6. At the same time, the I-V curve deviates from nonlinear to linear, and the threshold voltage of the p-n junction diode approaches zero due to the shrinkage of the built-in field, which is attributed to the competition between the primary (forward) p-n diode and the gradually appearing of the reverse p-n diode. When the thickness reaches 40 nm, n explodes to 354, meaning that the reverse p-n diode becomes comparable to the forward p-n diode, resulting in two asymmetric threshold voltages for both forward and reverse bias, as shown in FIG. 10C. The I-V curve is more symmetric when the thickness is thicker (see, e.g., FIG. 9B) and eventually behaves like a resistor, with a monotonous increase in a when the thickness increases. The results demonstrate that the SSC p-n junction diodes with a near zero-threshold voltage can be readily achieved by tuning the thickness of the (e.g. Ag, Au) film.

The SSC p-n junction diodes are built based on the work function difference between the two metallic shell layers. Without plasmon resonance, the Ag and Al shells share the same Fermi energy level. A large number of free electrons in Ag will gain higher kinetic energy and mobility by absorbing photon energy and becoming hot electrons via plasmon resonances, resulting in hot electrons entering Al and forming hot holes in Ag. Then the Fermi energy of Ag will be drawn lower than that of Al, and the difference between the two Fermi energy levels is approximately equal to the photon energy (~0.11±0.01 eV) of thermal infrared. A contact potential exists between Al and Ag shells, which builds an internal electric field with field direction from Ag to Al.

Unlike conventional semiconductor p-n junctions, where the built-in electric field arising from equilibration of the electron chemical potential is highly influenced by the external electric field, the internal electric (built-in) field in the SSC p-n junction is driven and determined only by the infrared light photons, independent of the external electric field. The built-in field is estimated to be ~$(2.9\pm0.5)\times10^5$ V/cm for the upper hemi-shell and ~$(1.0\pm0.2)\times10^6$ V/cm for the bottom hemi-shell. When the reverse external field is beyond the large built-in field, i.e., $1.0\times10^6$ V/cm, the p-n junction breaks down.

Different from conventional semiconductor p-n junction diodes, where only ordinary charge carriers contribute to the transport properties, hot charge carriers and ordinary charge carriers co-exist in the SSC p-n junction diodes. The generation rate of light-induced hot charge carriers is constant and determined by the infrared radiation and the light harvestability of the arrays. Without applying an external electric field, the generation and recombination of hot charge carriers reach equilibrium, and the density of hot charge carriers keeps constant. When a forward electric field is applied, different from free electrons, the hot electrons leaving the diode can not be replenished through the external circuit, and can only be generated via plasmon resonance in the bi-layer shell array. Therefore, a higher external electric field will drive more hot charge carriers out of the diode than that generated, resulting in a density decrease of hot charge carriers, i.e., the higher the external electric field, the lower the hot charge carriers' density. Or otherwise, the I-V curves will overlap when the external field is below a specific voltage. These phenomena are fully reflected in FIG. 2B, where the slope of the forward I-V curves gradually decreases with the increase of the initially applied voltage.

In summary, SSC p-n junction diodes based on nanostructured bi-layer (e.g. Ag/Al or Au/Al) shell arrays achieve a near zero-threshold voltage, which can be realized simply by tuning the bottom (e.g. Ag or Au, respectively) film thickness. The method to prepare the experiment samples is simple and produces stable and reproducible results. Distinguishing from conventional semiconductor p-n junction diodes, the internal electric field in the SSC p-n junction is driven and controlled by the infrared light photons and is independent of the external electric field; therefore, it is difficult to destroy, resulting in a much higher breakdown field than conventional semiconductor p-n junction diodes. SSC p-n junction diodes having a near zero-threshold voltage, and a high breakdown field, favor development of ultra-low-power SSC devices with distinguished properties.

Example 1

Fabrication of the Non-Close-Packed PS Template.

A polystyrene (PS) template was prepared via a self-assembly process at the air/water interface. 5 microliters of 10 wt % monodisperse polystyrene colloidal spheres with a diameter of 240 nm (purchased from Duke Corporation) were mixed with 25 microliters of DI water and 25 microliters of ethanol. The mixed colloidal suspension was slowly dripped onto a superhydrophobic glass slide with its surface covered by a thin layer of water. The PS spheres were trapped at the air/water interface and assembled into an ordered film until PSs covered the entire water surface. A cleaned, high resistance silicon wafer (purchased from Kejing Corporation) was used to pick up the PS template. The excess precursor solution on the surface of the colloidal monolayer was absorbed by filter paper. Subsequently, the samples were put into a benchtop plasma cleaner, Harrick PDC-32G-2, for plasma etching after the samples were dried at 40° C. for 30 min in air. The air plasma etching operating was performed for 4 or 6 min at 300 mTorr with 7 W power to form a non-close-packed PS template. Preferred diameters of the PS spheres after etching are in the range of 100 to 500 nm, with an edge-to-edge distance preferably in the range of ~10-20 nm.

Fabrication of the Bimetallic Arrays.

Co (99.99%), Al (99.99%), and Cu (99.99%) targets were purchased from Kejing Corporation. Al shell arrays were prepared from an Al target to deposit Al on the PS substrates by D.C. magnetron sputtering (DE 500). The base pressure of the sputtering chamber was maintained at $10^{-4}$ Pa. The argon pressure was kept at 0.8 Pa during sputtering with a power of 60 W. The deposition time was 1300 s with a growth speed of ~4.6 nm/min.

Co/Al arrays were fabricated via a step-by-step method: the Co layer was first fabricated on the PS spheres and then the Al layer was deposited on the Co layer. The Co/Al/Co/Al arrays were fabricated by alternatively depositing Co and Al layers. In embodiments, the deposition thickness of the plasma resonance metal (e.g. Co) was about 10 nm, and the thickness of connecting metal (e.g. Al) was about 100 nm. The plasma resonance metal may be any metal that, at least when disposed with suitable dimensionalities (e.g. layer thickness and/or porosity), has a plasmonic effect, more specifically a plasmonic effect induced by infrared photons, including but not limited to Co, noble metals, such as Ag, Au, Cu, and PGM Platinum Group Metals (PGM): Ru, Th, Os, Ir, Pt, Pd. The connecting metal (e.g. Al, Cu) may be any metal different than the plasma resonance metal that does not intermingle (i.e. form an alloy) with the plasma resonance metal, preferably a metal with excellent conductivity (as defined elsewhere herein). The bimetallic arrays with nanoscaled films typically transfer from a metallic state to a semiconducting state when the ambient temperature is high enough (typically higher than 210 K).

An exemplary Co/Cu array was also manufactured by the step-by-step sputtering method. The shells were non-close-packed (i.e. the shells are not directly in contact with one another; e.g., see FIGS. 2A and 2D) and were connected by the bottom porous film and bridging connections between neighboring PS spheres. Exemplary structural parameters of the bottom porous film and the fabrication parameters are shown in Table 3.

TABLE 3

| Fabrication Parameters | PSs 240 nm etching 4 min | PSs 240 nm etching 6 min | PSs 150 nm etching 2 min | PSs 150 nm etching 3 min |
|---|---|---|---|---|
| Al arrays | | | | |
| Deposition thickness | 100 nm | 100 nm | | |
| Period | d ≈ 240 nm | d ≈ 240 nm | | |
| Porous thickness | t ≈ 8 nm | t ≈ 30 nm | | |
| Co array | | | | |
| Deposition thickness | 10 nm | | | |
| Period | d ≈ 240 nm | | | |
| Porous thickness | t ≈ 1 nm | | | |
| Co/Al arrays | | | | |
| Deposition thickness | 10/100 nm, 20/100 nm | 10/100 nm | 10/100 nm | 10/100 nm |
| Period | d ≈ 240 nm | d ≈ 240 nm | d ≈ 150 nm | d ≈ 150 nm |
| Porous thickness | t ≈ 9 nm, t ≈ 10 nm | t ≈ 33 nm | t ≈ 7 nm | t ≈ 9 nm |
| Co/Al/Co/Al array | | | | |
| Deposition thickness | 10/80/10/20 nm | | | |
| Period | d ≈ 240 nm | | | |
| Porous thickness | t ≈ 10 nm | | | |
| Co/Cu array | | | | |
| Deposition thickness | 10/50 nm | | | |
| Period | d ≈ 240 nm | | | |
| Porous thickness | t ≈ 6 nm | | | |

Note: In Table 3, the deposition thickness, equal to deposition rate times deposition time, is the nominal thickness instead of the actual thickness. The thickness of the sputtered metal on PSs is gradually thinned from top to bottom. The average thickness of the metal shell on the upper hemisphere is about half that of the deposition on flat film. The average thickness of the shell on the bottom hemisphere is approximately equal to the thickness of the porous film.

The morphologies of the PS templates and the metallic nanoshell arrays were observed by using a field-emission scanning electron microscope (FE-SEM, Hitachi S-4800) and an atomic force microscope (AFM, Bruker Dimension Icon). The transport properties of samples were measured with a physical property measurement system (PPMS). The magnetic properties of samples were characterized by the superconducting quantum interference device (SQUID) magnetometer. Infrared light absorptions of samples were recorded on a Nicolet IS50 range from 2.5 to 25 µm. The I-V curves under infrared light radiation were obtained by applying a Fourier transform infrared spectrometer (FT-IR, Bruker vertex70) with a wavelength 1.35-14.28 µm at room temperature. The infrared light absorption measurements at different temperatures were conducted at the infrared beamline BL01B of China's National Synchrotron Radiation Laboratory with a wavelength 1.25-16.67 µm. The work functions were measured by ultraviolet photoelectron spectroscopy (UPS) with a bias of −10 V.

Simulations of the optical spectra of the Co/Al nanoshell arrays were performed using a finite-difference time-domain (FDTD) method. A plane wave source was chosen at a working wavelength ranging from 3 to 20 µm. Periodic boundary conditions were used in x- and y-directions (parallel to the film), while a perfect-matched-layer was used in the z-direction (perpendicular to the film). The incident light was polarized along the x-axis. The Co/Al array spectrum calculated using FDTD showed that the absorption peak at ~11.2 µm is plasmon resonance.

Example 2

Fabrication of the Non-Close-Packed PS Template

A polystyrene (PS) template was prepared via a self-assembly process at the air/water interface. 5 microliters of 10 wt % monodisperse polystyrene colloidal spheres with a diameter of 240 nm (purchased from Duke Corporation) were mixed with 25 microliters of DI water and 25 microliters of ethanol. The mixed colloidal suspension was slowly dripped onto a superhydrophobic glass slide with its surface covered by a thin layer of water. The PS spheres were trapped at the air/water interface and assembled into an ordered film until PSs covered the entire water surface. A cleaned monocrystalline (100) silicon wafers (purchased from Kejing Corporation) with different thickness metal film (from 7-80 nm) were used to pick up the PS template. The excess precursor solution on the surface of the colloidal monolayer was absorbed by filter paper. Subsequently, the samples were put into a benchtop plasma cleaner, Harrick PDC-32G-2, for plasma etching after the samples were dried at 40° C. for 30 min in the air. The air plasma etching operation was performed for 4 min at 300 mTorr with 7 W power to form a non-close-packed PS template.

Fabrication of the Metallic Bi-Layer Shell Arrays

Ag (99.99%), Al (99.99%), and Au (99.99%) targets were purchased from Kejing Corporation. Ag (or Au) films with different thicknesses were prepared from an Ag (or Au) target to deposit Ag (or Au) on the PS templates by DC magnetron sputtering (DE 500). The base pressure of the sputtering chamber was maintained at $10^{-4}$ Pa. Argon pressure was kept at 0.8 Pa during sputtering with a power of 30 W and a growth speed of ~4.2 (4.4) nm/min.

An Ag (or Au) layer was first fabricated on the PS arrays, and then an Al layer was deposited on the Ag (or Au) layer.

The deposition thickness of Ag (or Au) shells was 10 nm, and the average thickness of the upper hemi-shells was about 5 nm. The deposition thickness of Al shells was 100 nm, and the average thickness of the upper hemi-shell was ~50 nm. The shells were non-close-packed and connected by the bottom film.

Measurements.

The morphologies of the PS templates and the metallic nanoshell arrays were observed using a field-emission scanning electron microscope (FE-SEM, Hitachi S-4800). The I-V curves at room temperature were characterized using Keithley 4200 with two electrodes in an $N_2$ protection environment. The I-V curves at different temperatures were measured with a physical property measurement system (PPMS) in the He protection environment. Infrared light absorptions of samples were recorded on a Nicolet IS50 ranging from 2.5 μm to 25 μm. The work functions were measured by ultraviolet photoelectron spectroscopy (UPS) with a bias of −5 V.

Power Consumption of the p-n Junction Diodes.

The Ag/Al diodes can be considered as a hexagonal column with a center-to-center distance of neighbor diodes of 240 nm, each diode will take an area of ~0.05 μm², and the diode density is ~20/μm² or $2 \times 10^7$/mm². Based on the typical I-V curve from FIG. 2A, the current is ~60 μA at 1 V and ~6 μA at 0.1 V. In the example, the electrode covers an area of about 1 mm². Thus, the power consumption per square millimeter is ~$6 \times 10^{-5}$ W at a working voltage of 1 V, and ~$6 \times 10^{-7}$ W at a working voltage of 0.1 V, i.e., the power consumption per trillion diodes is 3 W at a working voltage of 1 V or 30 mW at a working voltage of 0.1 V.

Finite-Difference Time-Domain Simulations.

Simulations of the optical spectra of the Al and Ag/Al nanoshell arrays were performed with the finite-difference time-domain (FDTD) method. A plane wave source was chosen at a working wavelength ranging from 3 to 20 μm. Periodic boundary conditions were used in x- and y-directions (parallel to the film), while a perfect-matched-layer was used in the z-direction (perpendicular to the film). The incident light was polarized along the x-axis.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A super-semiconductor (SSC) comprising a bimetallic nanostructured array, the bimetallic nanostructured array comprising:
   a substrate; and
   a nanoshell array disposed on the substrate, the nanoshell array comprising a plurality of non-close-packed, non-conductive, core bodies disposed on the substrate, a first metal layer comprising a first metal disposed on the non-conductive core bodies and on the substrate in areas located between adjacent non-conductive core-bodies, and at least a second metal layer comprising a second metal disposed on the first metal layer, wherein the second metal is different than the first metal, wherein the bimetallic nanostructured array exhibits p-type or n-type semiconducting behavior above a transition temperature.

2. The SSC of claim 1, wherein the second metal is a metal that does not form an alloy with the first metal, the first metal as disposed in the first metal layer exhibits a plasmonic effect induced by infrared photons, and the second metal has an electrical conductivity above a predetermined threshold.

3. The SSC of claim 2, wherein the first metal comprises a Noble metal.

4. The SSC of claim 2, wherein the first metal is selected from the group consisting of Co, Au, Ag, Ru, Th, Os, Ir, Pt, and Pd.

5. The SSC of claim 4, wherein the second metal has an electrical conductivity greater than 10×106 S/m.

6. The SSC of claim 5, wherein the second metal has an electrical conductivity greater than 20×106 S/m.

7. The SSC of claim 6, wherein the second metal has an electrical conductivity greater than 40×106 S/m.

8. The SSC of claim 4, wherein the second metal is selected from the group consisting of Al, Cu, Au, Al, Zn, Ni, Ir, Pt, Rh, and Cd.

9. The SSC of claim 1, wherein the nanoshell array further comprises a third layer comprising a third metal and a fourth layer comprising a fourth metal.

10. The SSC of claim 9, wherein the third metal is the same as the first metal and the fourth metal is the same as the second metal.

11. The SSC of claim 10, wherein the nanoshell array comprises a plurality of alternating layers of the first metal and the second metal.

12. The SSC of claim 11, wherein the nanoshell array comprises two alternating layers of the first metal and the second metal.

13. The SSC of claim 1, wherein the nanoshells have an inner diameter in a range of 100 to 500 nm.

14. The SSC of claim 1, wherein the nanoshell core bodies comprise spheres.

15. The SSC of claim 14, wherein the nanoshell core bodies comprise polystyrene (PS), SiO2 or Al2O3.

16. The SSC of claim 1, wherein the first metal layer has a thickness that is smaller than the second metal layer.

17. The SSC of claim 16, wherein the first metal layer has a thickness that is an order of magnitude smaller than the second metal layer.

18. The SSC of claim 17, wherein the first metal layer has an average thickness of 5-50 nm in upper hemi-shell regions of the array.

19. The SSC of claim 1, wherein the transition temperature is in a range of 210-240 K.

20. The SSC of claim 1, wherein the substrate comprises a semi-conductor.

* * * * *

UNITED STATES PATENT AND TRADEMARK OFFICE
CERTIFICATE OF CORRECTION

PATENT NO. : 12,317,575 B2  
APPLICATION NO. : 18/864780  
DATED : May 27, 2025  
INVENTOR(S) : Wei et al.

Page 1 of 1

It is certified that error appears in the above-identified patent and that said Letters Patent is hereby corrected as shown below:

In the Claims

Column 20, Line 19, Claim 5: delete "10×106 S/m." and insert -- $10 \times 10^6$ S/m. --

Column 20, Line 21, Claim 6: delete "20×106 S/m." and insert -- $20 \times 10^6$ S/m. --

Column 20, Line 23, Claim 7: delete "40×106 S/m." and insert -- $40 \times 10^6$ S/m. --

Signed and Sealed this  
Twenty-second Day of July, 2025

Coke Morgan Stewart  
*Acting Director of the United States Patent and Trademark Office*